(12) United States Patent
Beermann

(10) Patent No.: US 12,413,238 B2
(45) Date of Patent: Sep. 9, 2025

(54) MEASUREMENT UNIT CONFIGURED TO PROVIDE A MEASUREMENT RESULT VALUE USING CALCULATED VALUES

(71) Applicant: Advantest Corporation, Tokyo (JP)

(72) Inventor: Andreas Beermann, Stuttgart (DE)

(73) Assignee: Advantest Corporation, Tokyo (JP)

( * ) Notice: Subject to any disclaimer, the term of this patent is extended or adjusted under 35 U.S.C. 154(b) by 306 days.

(21) Appl. No.: 17/733,403

(22) Filed: Apr. 29, 2022

(65) Prior Publication Data

US 2022/0263516 A1    Aug. 18, 2022

Related U.S. Application Data

(63) Continuation of application No. PCT/EP2020/062796, filed on May 7, 2020.

(51) Int. Cl.
   *H03M 1/06*     (2006.01)
   *G04F 10/00*    (2006.01)

(52) U.S. Cl.
   CPC ........ *H03M 1/0634* (2013.01); *G04F 10/005* (2013.01)

(58) Field of Classification Search
   CPC ........ H03M 1/0634; H03M 1/12; H03M 1/50; G04F 10/005
   See application file for complete search history.

(56) References Cited

U.S. PATENT DOCUMENTS

| | | | | |
|---|---|---|---|---|
| 6,388,963 B1 * | 5/2002 | Tanaka | ................. | G11B 7/0903 |
| | | | | 369/44.37 |
| 8,081,946 B2 * | 12/2011 | Fudge | ................. | H04B 1/1036 |
| | | | | 455/295 |
| 9,246,500 B2 * | 1/2016 | Perrott | .................... | H03L 7/093 |
| 2005/0075567 A1 * | 4/2005 | Skyba | ................. | G01S 7/52038 |
| | | | | 600/443 |
| 2016/0305838 A1 | 10/2016 | Wiesbauer et al. | | |
| 2018/0115406 A1 | 4/2018 | Moore et al. | | |

FOREIGN PATENT DOCUMENTS

EP          2796945 A1    10/2014

* cited by examiner

*Primary Examiner* — Tung S Lau
(74) *Attorney, Agent, or Firm* — Artegis Law Group, LLP

(57) ABSTRACT

A measurement unit comprising a converter unit and a processing unit and configured to provide a measurement result value, based on a first input signal. The converter unit is configured to provide first digital, quantized values based on the first input signal. The measurement unit is further configured to calculate second values, which represents a reference quantity or a reference value, for a plurality of quantization step sizes associated with different values of the control signal. The measurement unit is configured to change the control signal of the converter unit between determination of different first values and/or a determination of the different second values, such that different first values and/or different second values are provided using different converter quantization step sizes. The processing unit is configured to provide a measurement result value from a predefined number of first values and a predefined number of second values.

33 Claims, 2 Drawing Sheets

MEASUREMENT UNIT CONFIGURED TO PROVIDE A MEASUREMENT RESULT VALUE USING CALCULATED VALUES

CROSS-REFERENCES TO RELATED APPLICATIONS

This application is a continuation of copending International Application No. PCT/EP2020/062796, filed May 7, 2020, which is incorporated herein by reference in its entirety.

DESCRIPTION

Technical Field

The present invention relates to a measurement unit configured to provide a measurement result value. The present invention relates to a measurement unit comprising a digital converter unit, such as an analog-to-digital converter (ADC) or a time-to-digital converter (TDC) unit. The present invention relates to improving the resolution of time-to-digital and/or analog-to-digital conversion measurements.

Background of the Invention

Modern analog-to-digital converters (ADC) and/or time-to-digital converters (TDC) have a fixed resolution of the digital output signal determined by the discrete values of the measurement result. In some cases the resolution of such converters, ADC and/or TDC, is not sufficient.

Common approaches to increase the converter resolution are oversampling and dithering.

Oversampling means sampling with a higher frequency, then decimating the signal with a digital low-pass filter. This approach fails for static signals, such as DC levels, because the converter will always measure the same values so that low-pass filtering over a larger amount of measurements will still result in the same value.

In some cases, both clocks have a constant phase shift and frequency, thus having a static (='DC') signal. This means that simple averaging of a higher number of measurement results does not increase the measurement resolution.

Dithering uses the same approach as oversampling but with artificial noise added to the measured signal to allow some averaging in the low-pass filter. It works for DC signals as well but the noise signal and the low-pass filtering cutoff frequency have to be chosen carefully to eliminate the noise signal completely by filtering.

For time-to-digital-converters the dithering approach is hard to implement because adding noise in the time domain means adding jitter. Jitter is not easy to apply to an existing clock in a controlled way. As a consequence this option has been dropped.

There is a need for improving the resolution of a digital conversion measurement.

SUMMARY OF THE INVENTION

In an embodiment according to an aspect of the invention, a measurement unit is provided (see, for example, claim 1) configured to provide a measurement result value, such as $$\frac{\sum T_{edge}(k)}{\sum T_{period}(k)},$$

based on a first input signal, such as a first clock signal or a voltage signal of a temperature dependent resistor. The measurement unit comprises a converter unit, such as TDC or ADC, and a processing unit or an averaging unit.

The converter unit, such as TDC, ADC, is configured to provide first digital, quantized values, such as $T_{edge}$, $V_{ref-R}$, based on the first input signal or is derived from the first input signal and a second input signal, such as a second clock signal.

The measurement unit is further configured to calculate second values, such as $V_{ADC}$, which represents a reference quantity or reference value, $V_{in}$, for a plurality of quantization step sizes associated with different values of the control signal, for example, on the basis of a digital representation of the control signal.

The quantization step size, or the TDC delay stages delay time unit, of the first values are based on a control signal, such as the delay stages supply voltage, or $V_{ref}$ of the ADC converter unit.

The measurement unit is configured to change the control signal of the converter unit between determination of different first values and/or a determination of the different second values, such that different first values and/or different second values are provided using different converter quantization step sizes.

The processing unit or the averaging unit is configured to provide a measurement result value from a predefined number of first values and a predefined number of second values, such that, an impact of the converter quantization step sizes onto the first values and onto the second values cancels out, at least partially.

The measurement unit comprises a converter unit and a processing unit. The first input signal is provided to the converter unit of the measurement unit.

The converter unit is configured to provide first digital quantized values, while the second values are calculated by the measurement unit.

The quantization step sizes of the first values and the second values are based on a control signal. The control signal of the converter unit is changed between a determination of different first values and/or a determination of different second values, thus resulting in different first values and/or different second values. In other words, different first values and/or different calculated second values are provided depending on the control signals.

The first values and the calculated second values are provided to the processing unit or averaging unit. The processing unit collects a predefined number of first values and a predefined number of calculated second values. The processing unit provides a measurement result from the predefined number of first values and from the predefined number of calculated second values, such that an impact of the quantization step sizes onto the first values and onto the second values cancels out. The measurement results provided by the processing unit is the measurement result of the measurement unit.

In a preferred embodiment (see, for example, claim 2), the quantization step size is calculated from the value of the control signal, e.g. by dividing the control signal voltage level by the total number of quantization steps.

For example, the quantization step can be defined by corresponding the range of the control signal to the total number of quantization steps. This proportionality allows a control of the quantization step size by the control signal.

In a preferred embodiment (see, for example, claim 3), the processing unit is configured to determine the measurement result value on the basis of the first values and on the basis of the second values using an averaging.

Using an averaging in the process of providing a measurement result value from a predefined number of first values and a predefined number of second values reduces the number of values from a predefined number to one measurement result value. In other words, the predefined number of first values and/or the predefined number of second values can be reduced, for example, to one single value with the usage of averaging.

In a preferred embodiment (see for example claim 4), the processing unit is configured to average quotient values of the first values and the second values, in order to obtain the measurement result value.

Averaging the quotient values of first values and second values leads to a single measurement result value, affected by all the quotient values.

According to an embodiment (see for example claim 5), the processing unit is configured to calculate the measurement result value based on a following equation:

$$\text{result} = \frac{1}{n} \cdot \sum_{k=1}^{n} \frac{val_1(k)}{val_2(k)}$$

In the equation above:
result represents the measurement result value,
n represents the predefined number of measurements,
$val_1(k)$ represents the k-th element of the predefined number of first values,
$val_2(k)$ represents the k-th element of the predefined number of second values,
k represents a running variable.

According to an embodiment (see for example claim 6), the processing unit is configured to calculate a quotient value of a sum of the first values and a sum of the second values or a quotient value of an average of the first values and an average of the second values, in order to obtain the measurement result value.

A quotient value of a sum of the first values and a sum of the second values can be approximated by calculating the quotient value of an average of the first values and an average of the second values.

Calculating the quotient value of an average of the first values and an average of the second values is an approximate solution, which has some deviation to the solution of calculating the sum of the quotients, especially when the distribution of the converter step size values is asymmetric.

However, the approximation is good enough or even better, because it does not suffer from rounding errors that occur when summing up the quotients. Quotients are fractional numbers, being rounded after a certain number of digits. When summing up the quotients, rounding errors are summing up as well.

Calculating a quotient value of a sum of the first values and a sum of the second values need far less mathematical division operations, than calculating the average of the quotient values of the first values and the second values. The reduction of the mathematical division operations results in a faster calculation and/or a reduction of the processing power needed to conduct the calculations.

Although the computation complexity is reduced drastically, simulations show that a computation accuracy similar to the computation accuracy of an average quotient value of the first values and the second values can be achieved.

In a preferred embodiment (see for example claim 7), the processing unit is configured to calculate the measurement result value based on a following equation:

$$\text{result} = \frac{\sum_{k=1}^{n} val_1(k)}{\sum_{k=1}^{n} val_2(k)}$$

In the equation above:
result represents the measurement result value,
n represents the predefined number of measurements,
$val_1(k)$ represents the k-th element of the predefined number of first values,
$val_2(k)$ represents the k-th element of the predefined number of second values,
k represents a running variable.

According to embodiments (see for example claim 8), the control signal is a control voltage signal or a control current signal.

Using a control voltage signal or a control current signal as a control signal in a measurement unit, results in a control signal, which can be set accurately using a wide variety of off-the-shelf solutions.

In a preferred embodiment (see for example claim 9), the control signal comprise an increasing and/or decreasing ramp signal or a sawtooth signal, or a periodically increasing and decreasing triangular signal, or a signal based on a mathematical function, such as sine wave, or a random, or pseudo random signal, or an arbitrary waveform stored in a memory.

Adapted to an actual use case, several different types of wave forms can be used as a control signal. Being flexible with the wave form, results in being adaptive to different measurement situations.

According to embodiments (see for example claim 10), the measurement unit comprises a control signal generator.

The measurement unit can receive the control signal from an external source and/or could have its own control signal generator. A control signal generator, for example a voltage generator and/or a current generator, can be controlled by the measurement unit in order to adapt the measurement conditions to the actual environment.

In a preferred embodiment (see for example claim 11), the measurement unit comprises a control logic, configured to control and/or oversee and/or supervise the converter unit and/or the processing unit and/or the control signal.

The control logic of the measurement unit may trigger the control signal generator unit to set a new control voltage or a new control current level for the next measurement. Furthermore, the control logic triggers the converter unit to conduct measurements. Moreover, the control logic can trigger a measurement unit to accumulate first values and second values and conduct an averaging operation. In other words the control unit align or harmonize the operation of the signal generator unit, of the converter unit and of the processing unit.

In a preferred embodiment (see for example claim 12), the first input signal and the second input signal are stationary over a predefined number of measurements.

Static and/or constant input signals can be measured with the measurement unit. To make the measurement non-static the control signal of the converter unit is changed from measurement to measurement, for example, by the control logic, if available. The processing unit accumulates the first values and the second values provided by the measurement unit and conducts an averaging operation, wherein an impact of the changing quantization step sizes cancels out, at least partially.

In a preferred embodiment (see for example claim 13), the converter unit is a time-to digital converter or an analog-to-digital converter.

The measurement unit is generic and can comprise different types of converters for example, a TDC or an ADC. The measurement unit can be used in applications where the final measurement result is a quotient between two values in a way that the changing control signal of the converter or the actual quantization step sizes are cancelled out by the division.

According to embodiments (see for example claim 14), the converter unit is a TDC providing time values from an edge of the first input signal to an edge of the second input signal, such as a second clock signal, and/or time values of a period of the first input signal, like a first clock signal, or a period of the second input signal, like a second clock signal.

The converter unit of the measurement unit can be a TDC with one or more clock signals as input signals. The TDC provides an output, or a first output, which can be a time value from an edge of the first input signal, or first clock signal, to an edge of the second input signal, or second clock signal, and/or time values of a period of the first input signal or a period of the second input signal.

In a preferred embodiment (see for example claim 15), the quantization step sizes of the time value of a period of the first input signal, or first clock signal, or of the time value of a period of the second input signal, or second clock signal, or the quantization step sizes of the time value between the edge of the first input signal, or first clock signal, and the edge of the second input signal or second clock signal are varied.

Variation in the quantization step sizes will result in a different time value of a period of the first input signal and/or second input signal and in a different time value between the edge of the first signal and the edge of the second input signal, even if only the quantization step sizes are varied. Keeping the input signals the same and varying the quantization step sizes will result in different output values. Averaging these different output values results in an improved resolution of the measurement unit.

According to embodiments (see for example claim 16), the result value is a phase deviation between the first input signal and the second input signals.

A possible measurement result value of the measurement unit is a phase deviation between the first input signal and the second input signal. The phase deviation can be calculated by a quotient between the time deviation of two clock signal edges and a clock period. With the help of the division, the quantization step sizes cancel out from the calculation.

In a preferred embodiment (see for example claim 17), the first input signal is a clock signal and/or the second input signal is a clock signal.

Using a TDC as a converter unit, inputs are required to be time related inputs. Clock signals are time related inputs, allowing precise measurement of the passing time within a predefined error range.

In a preferred embodiment (see for example claim 18), the frequency of the first input signal and the frequency of the second input signal are the same or substantially similar or where a ratio between the frequency of the first input signal and the frequency of the second input signal is equal to a ratio between a first integer number and a second integer number being smaller than 20.

A simple rational relation between the frequency of the first input signal and the frequency of the second input signal, such as being the same or similar, or one of the frequencies is an integer multiple of the other one, resulting in a static phase deviation or in a static measurement result value.

The relation between the frequencies of the first input signals and the second input signals can be corrected, thus avoiding additional mathematical errors related to nearly constant time shifts, or time shifts with a linear relation between the first input signals and second input signals.

In a preferred embodiment (see for example claim 19), the control signal of the converter unit changes time unit.

Changing the time unit results in small changes in the measured time values, such as period values and/or edge to edge time differences. Conducting several measurements with slightly different time units result in slightly different measured time values. Averaging the slightly different measured time values will provide an output value with a better resolution.

According to an embodiment (see for example claim 20), the control signal of the converter unit varies or adjusts frequency of one or more oscillators, or ROs, which act as a time reference, defining temporal quantization step sizes. For example, a voltage control signal of the converter unit varies or adjusts frequency of one or more voltage controlled oscillators (VCO).

The converter unit of the measurement unit comprises an oscillator or a RO. The oscillator defines the temporal quantization step sizes, or the time references, which can be varied by changing the control signal of the converter unit. Having an oscillator in the converter unit makes it easier to adjust or vary the time reference or the quantization step sizes.

In a preferred embodiment (see for example claim 21), the control signal of the converter unit varies or adjusts a supply voltage or a supply current of an oscillator or RO in order to vary the quantization step sizes.

The measured signals are converted into non-static signals by changing the quantization step sizes. The quantization step sizes are set and/or varied by a variation of the control signal of the supply voltage or a supply current of the oscillator or RO. The electrical supply of the oscillator, can be, for example, the control signal of the converter unit. By varying the control signal of the converter, i.e., the supply voltage or supply current of the oscillator or RO, the quantization step sizes will vary.

According to embodiments (see for example claim 22), the converter unit or the quantization of the converter unit is based on delay stages.

Stage delays can be used for continuously measuring the time between an edge of the first clock signal to the edge of the calculated second clock values and/or to measure the time of the full clock period of the clock signals. The measurements can be done simultaneously and the result will be in the units of the stage delay.

In a preferred embodiment (see for example claim 23), the control signal of the converter unit varies or adjusts the delay value of delay stages of a chain or a ring of delay stages in order to vary the quantization step sizes.

The converter unit of the measurement unit can comprise, for example, a RO with more than one delay stage. Varying the control signal of the converter unit can adjust one or more delays of a chain or a ring of delay stages. The resolution of a single measurement of an oscillator based converter unit is determined by the stage delay of the oscillator. The oscillator stage delay can be changed in small ranges by varying the supply voltage or supply current of the oscillators delay stages.

In a preferred embodiment (see for example claim 24), the quantization step sizes, e.g., the stage delay value, are varied by at least 5%, by at least 50%, by at least 100% or by at least 150%.

The variation of the quantization step sizes or the stage delay values is adaptable to different measurement requirements.

In a preferred embodiment (see for example claim 25), the quantization step sizes are varied such that the digitized first values and/or the calculated second values change for a stationary first signal and/or a reference quantity, such as $V_{in}$, in response to the change of the quantization step size.

Even if the first input signal and/or the reference quantity is static, the variation or change of the quantization step sizes result in a variation of the digitized first values and/or the calculated second values. Conducting an averaging operation on the different digitized first values and/or calculated second values based on different quantization step sizes results in an improved resolution of the measurement result value.

In a preferred embodiment (see for example claim 26), the converter unit is an analog-to-digital converter, providing first voltage or current values from a first input signal.

The measurement unit is a generic measurement unit, which can comprise an analog-to-digital converter as a converter unit. The ADC provides first digital voltage and/or current signals from a first input signal. Second values are calculated based on a reference quantity.

According to embodiments (see for example claim 27), the quantization step size of the first voltage or current values and the quantization step size of the second voltage or current values are varied.

The measured first input signal is converted into non-static signal by modifying the quantization step sizes. While the static reference quantity is converted into non-static calculated values by modifying the quantization step sizes. Changing the quantization step sizes results in slightly different digital values. Conducting an averaging operation on the slightly different digital values improves the resolution of the calculated measurement result value.

In a preferred embodiment (see for example claim 28), the result value is a quotient value.

Using a quotient value as a measurement result value has the benefit of the cancellation of the quantization step sizes. Thus the selection of a quantization step size does not affect the measurement result value.

In a preferred embodiment (see for example claim 29), the first input signal is a voltage or a current signal and/or the calculated second value is a digital voltage or a digital current quantity.

A voltage or a current signal is used as a first signal and a digital voltage or digital current quantity is calculated as calculated second values, in which the measurand is the same for the first signal and the calculated second values, resulting in that the quantization steps cancels out in the division operation.

In a preferred embodiment (see for example claim 30), the control signal of the converter unit change voltage or current reference, or voltage or current unit.

The voltage or current reference or voltage or current unit is dependent on the control signal of the converter unit. The voltage or current unit is cancelled out by a division operation.

In a preferred embodiment (see for example claim 31), the control signal of the converter unit varies or adjusts a supply voltage or a supply current of an ADC in order to vary the quantization step size.

The supply voltage or the supply current of an ADC is adjusted by the control signal, in order to provide different or slightly different quantization step sizes, providing different first digital values. The quantization step size cancels out in a division operation.

According to embodiments (see for example claim 32), the quantization step size, e.g., voltage or current steps, are varied by at least 5%, by at least 50%, by at least 100% or by at least 150%.

The variation of the quantization step size can be adapted to the actual measurement environment.

In a preferred embodiment (see for example claim 33), the quantization step size is varied such that, the digitized first voltage or current values changes for a stationary first signal, in response to the change of the quantization step size.

Even if the first signal and/or the second signal are stationary, a change in the quantization step sizes results in a change in the digitized first voltage or current values. By changing the quantization step size, the input signal is converted into non-static signals.

The features and/or functionalities and/or details described herein can be applied both individually and taken in combination.

BRIEF DESCRIPTION OF THE FIGURES

In the following embodiments of the present disclosure are described in more detail with reference to the figures in which.

DETAILED DESCRIPTION OF THE EMBODIMENTS

In the following, different inventive embodiments and aspects will be described. Also, further embodiments will be defined by the enclosed claims.

It should be noted that any embodiments as defined by the claims can be supplemented by any of the details, features and/functionalities described herein. Furthermore, the embodiments described herein can be used individually and also optionally be supplemented by any of the details and/or features and/or functionalities included in the claims.

Also, it should be noted that individual aspects described herein can be used individually or in combination. Thus, details can be added to each of said individual aspects without adding details to another one of said aspects.

It should be noted that the present disclosure describes, explicitly or implicitly, features usable in a measurement unit with a converter unit and a processing unit. Thus, any of the features described herein can be used in the context of a measurement unit with a converter unit and a processing unit.

The invention will be understood more fully from the detailed description given below and from the accompanying drawing of embodiments of the invention which, however, should not be taken to limit the invention to the specific embodiments described but are for explanation and understanding only.

Figure 1:
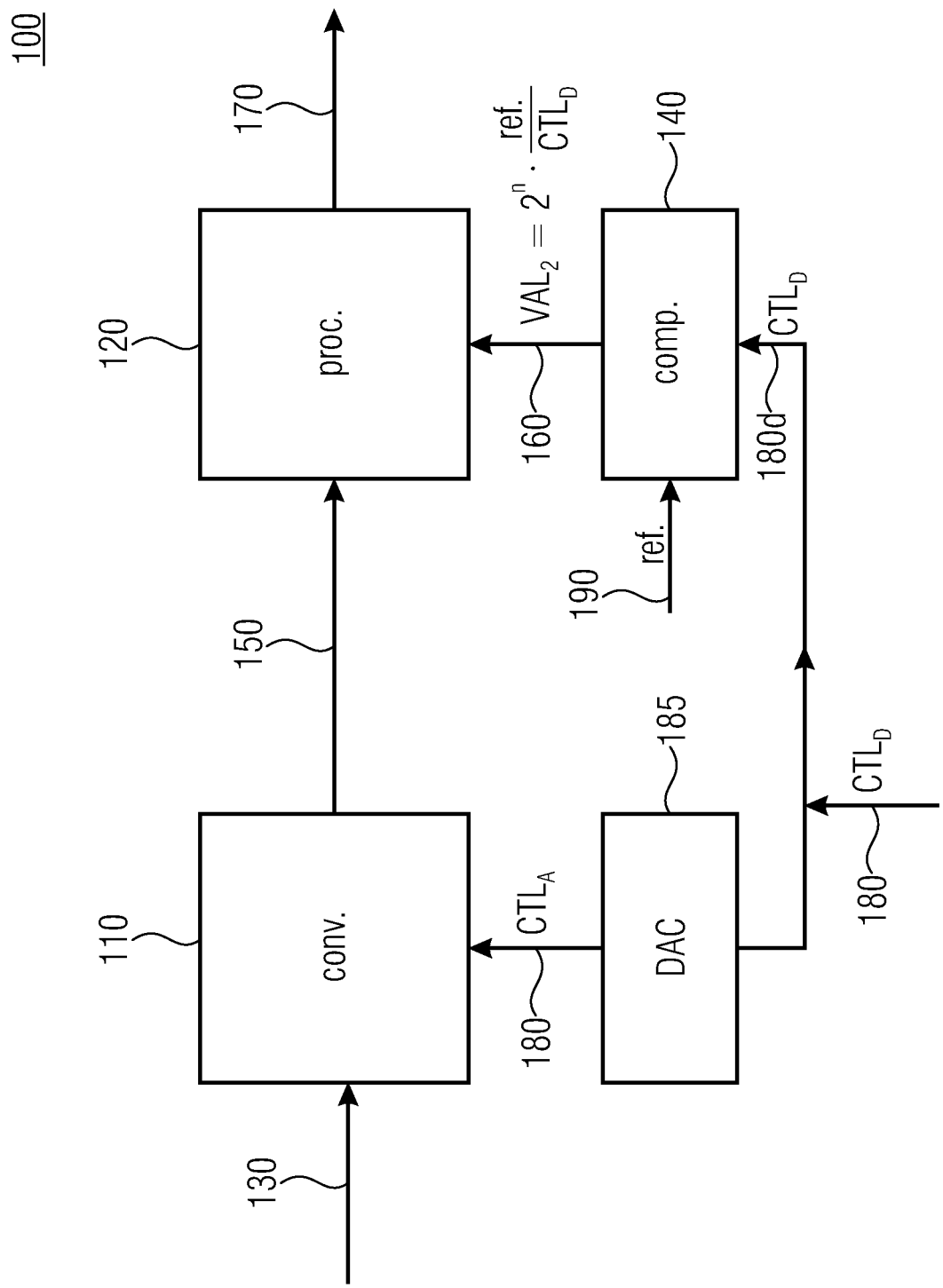
FIG. 1 shows a schematic measurement unit, comprising a converter unit, a processing unit and a computing unit.

Embodiment According to FIG. 1

FIG. 1 shows a schematic block diagram of a measurement unit 100 comprising a converter unit 110, a processing unit 120 and a computing unit 140. The measurement unit 100 has one input signal, the first input signal 130 and provides one output, a measurement result value 170.

The first input signal 130 and a control signal 180 is provided to the converter unit 110, for example an ADC, which provides first digital values 150 to the processing unit 120 based on the first input signal 130.

The processing unit 120 is coupled to the converter unit 110 and to the computing unit 140. The processing unit 120 is configured to collect first digital values 150 provided by the converter unit 110 and second digital values 160 calculated by the computing unit 140.

The processing unit 120 is configured to conduct averaging and division operations or division and averaging operations on a predefined number of first digital values 150, and on a predefined number of second digital values 160, and is configured to provide the result as an output measurement result value 170 of the measurement unit 100.

The computing unit 140 is configured to calculate the second digital values 160, based on a constant reference quantity 190 and based on a digital control signal 180d. The digital control signal 180a is the analog version of the control signal 180d, generated by the DAC 185. In some cases, the computing unit 140, or the computing unit 140 and the DAC 185, is part of the processing unit 120.

For example, a possible formula for calculating the second values can be the following equation:

$$val_2 = 2^{n_{bits}} \cdot \frac{Ref}{CTL_D}$$

In which $val_2$ represents calculated second values 160, $n_{bits}$ represents the number of converter-bits, Ref represents the stable reference quantity 190 and $CTL_D$ represents the digital control signal 180d.

The first digital values 150 and the second digital values 160 are digital values, with quantization step sizes are based on the control signal 180. The converter unit 110 can comprise one or more oscillators. The oscillators can be supplied by the control signal.

The measurement unit is configured to change the digital control signal 180d of the computing unit 140 and with it the analog control signal 180a of the converter unit 110. Varying the control signal 180a results in different quantization step sizes in the converter unit 110 and/or in the computing unit 140, resulting in varying first digital values 150 and/or varying second digital values 160, even if the measured first input signal 130 and/or the reference quantity 190 is stable.

The processing unit 120 is configured to accumulate a predefined number of first values 150 and a predefined number of second values 160 and to provide the measurement result value 170 from the predefined number of first values 150 and the predefined number of second values 160, wherein an impact of the quantization step sizes onto the first values 150 and onto the second values 160 cancels out, at least partially.

The processing unit 120 is configured to conduct division and averaging operations or averaging and division operations on the first digital values 150 and on the second digital values 160. In the result of the division operation, the different quantization step sizes cancel out from the calculation.

The division and averaging operations or averaging and division operations conducted on the predefined number of first values 150 and second values 160 results in improving the resolution of the measurement result value 170.

In other words, the idea is to turn the measured signal 130 into a non-static signal not by modifying the signals themselves but by changing the quantization step sizes. To make the measurement non-static the analog control signal 180a and/or the digital control signal 180d is changed from measurement to measurement, performing each single measurement with a different control signal 180a or quantization step size, resulting in different first values 150 and different second values 160. Conducting averaging and division operations or division and averaging operations on these predefined number of first values 150 and second values 160 can improve the resolution of the measurement result value 170.

In other words, a measurement unit can comprise an ADC as a converter unit, a computing unit providing a modulated reference quantity or reference voltage, $V_{ref}$, as second value. The final measurement result value is provided by the processing unit as a quotient of a first input value measured by the ADC and a second input value calculated by a computing unit in a way that the actual quantization step size is cancelled out by the division.

For example, a temperature measurement with a temperature dependent resistor usually compares the temperature dependent resistor value against a reference resistor. In this application an ADC measures the voltage over the temperature dependent resistor and the voltage over the reference resistor. The quotient between both measurements is the final measurement result. The temperature measurements are often quasi static because temperatures change very slowly. To improve the accuracy, or resolution, the measurement could be done multiple times with a different control voltage or quantization step sizes of the ADC. The final result would then be computed as the average of all measurements.

Figure 2:
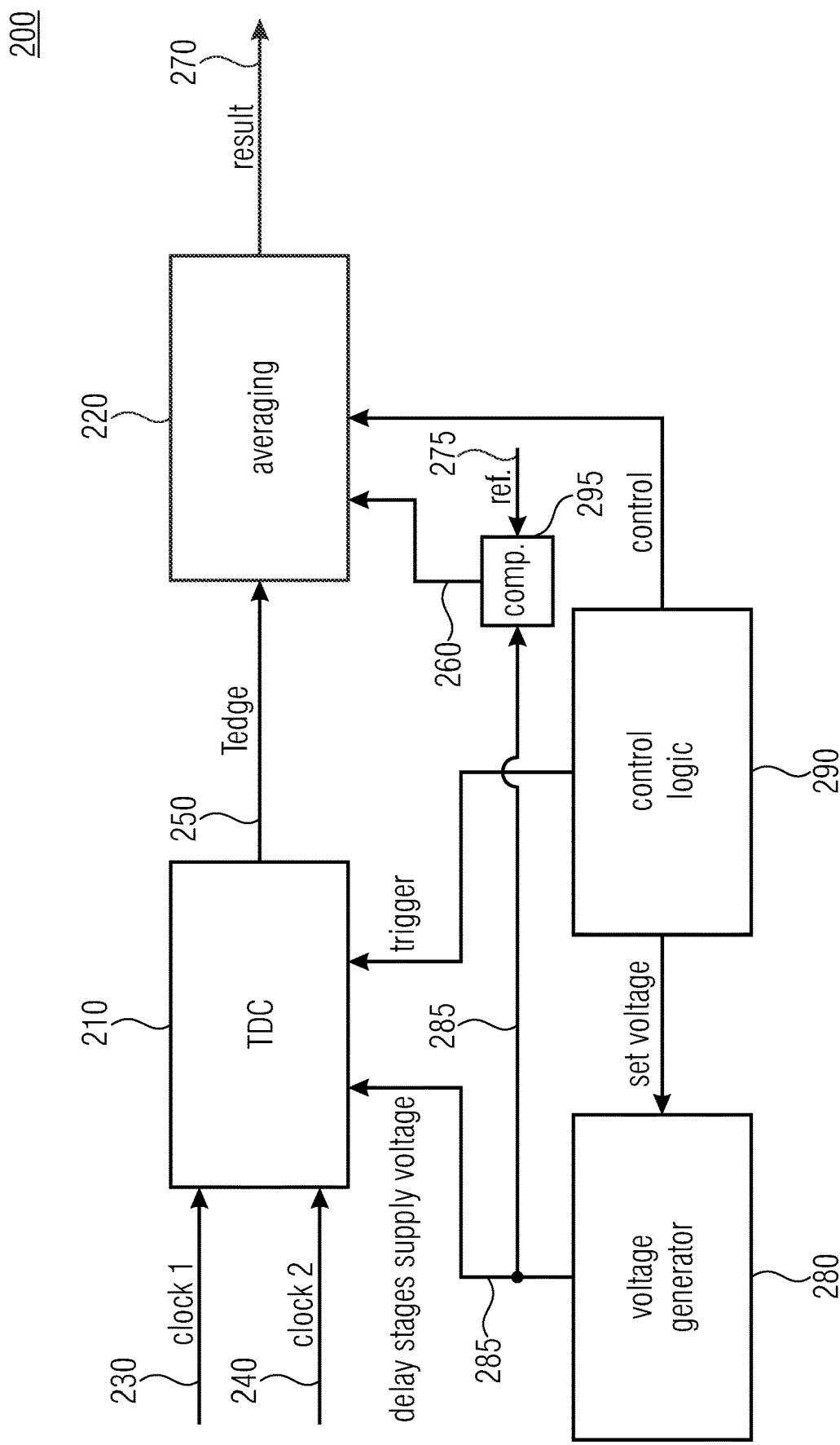
FIG. 2 shows a schematic measurement unit, comprising a converter unit, a processing unit, a control signal generator, a control logic, and a computing unit.

Embodiment According to FIG. 2

FIG. 2 shows an extended measurement unit 200, similar to the measurement unit 100 of FIG. 1. The measurement unit 200 comprises a converter unit 210, such as a time-to-digital converter (TDC), a processing unit 220, such as an averaging unit, a control signal generator 280, such as a voltage generator, a control logic 290 and a computing unit 295.

Two inputs, a first input signal 230, such as a first clock signal, and a second input signal 240, such as a second clock signal, are provided to the measurement unit 200. The measurement unit 200 outputs a measurement result value 270, for example a phase deviation of the first and second clock signals 230, 240.

The first clock signal 230 and the second clock signal 240 are provided to the converter unit 210 or to the time-to-digital converter (TDC).

The converter unit 210 is coupled to a control signal generator 280, such as a voltage generator, to a control logic 290, and provides first digital values 250 to the processing unit 220.

The processing unit 220 or averaging unit is coupled to the control logic 290, accepts first digital values 250 from the converter unit 210 and second digital values 260 from the computing unit 295 and outputs a measurement result value 270, which is the output value of the measurement unit 200.

The control signal generator 280, which can be a current generator or a voltage generator is coupled to the converter unit 210 and to the control logic 290.

The control logic 290 is coupled to the control signal generator 280, the converter unit 210, the computing unit 295 and the processing unit 220.

The computing unit 295 is coupled to the control signal generator 280 and to the averaging unit 220 and it has a reference quantity input 275. In some cases, the computing unit 295 is part of the processing unit 220.

The converter unit 210 is configured to provide a first time value 250 to the processing unit and is configured to continuously measure the time between an edge of the first clock signal 230 to an edge of the second input signal 240. The time unit of the converter unit 210 can be changed by changing the quantization step size. The quantization step size is based on the control signal 285 generated by the control signal generator 280.

The first time value 250 and the second time value 260 are digital values, provided to the processing or averaging unit 220. The processing unit 220 is configured to accumulate a predefined number of first digital values 250 and a predefined number of second digital values 260. The processing unit 220 is further configured to conduct a division operation and an averaging operation or an averaging operation on the accumulated first values 250 and on the accumulated second values 260 and is configured to provide the result as a measurement result value 270 of the measurement unit 200. With the division operation the impact of the quantization step sizes onto the first values 250 and onto the second values 260 cancels out, at least partially.

The second time value 260 is calculated and provided to the processing unit 220 by the computing unit 295. The calculated second time value 260 can represent a period calculated based on the control signal 285 and on the reference quantity 275.

The control signal generator 280, for example a current or voltage generator, is configured to provide the control signal 285 set by the control logic 290 to the converter unit 210 and/or to the computing unit 295. The control signal 285 can be varied by the control signal generator 280. For example, used as a supply voltage of oscillators, or ring oscillators (RO), in the converter unit 210 or in the computing unit 295 the variation of control signal results a change in the quantization step size or in the time unit of the converter unit 210 and/or of the computing unit 295.

The modulated control signal 285 of the RO of converter unit 210 can be, for example, one of the following signals:
- a ramp signal, increasing and/or decreasing control signal, like the control voltage level, by a small step from measurement to measurement over the period of n measurements and/or
- a triangular signal or a sawtooth signal, increasing and/or decreasing control signal, like the control voltage, periodically up and down over the whole period of n measurements and/or
- a signal generated based on a mathematical function, such as a sine wave, and/or
- a random and/or pseudo-random signal setting a new random value of the RO control signal, like the control voltage, at each measurement step and/or
- an arbitrary waveform, or pre-recorded waveform stored in a memory, that is used to modulate the RO control signal, like the control voltage.

The control logic 290 is coupled to the control signal generator unit 280, to the converter unit 210, the processing unit 220 and to the computing unit 295. The control logic 290 is configured to trigger the control signal generator unit 280 to set a new control signal 285 for the next measurement or measurements. The control unit is also configured to trigger a converter 210 unit to conduct a measurement. The control unit is further configured to trigger the processing unit 220 to accumulate the first digital values 250 measured by the converter unit 210 and the second digital values 260 calculated by the computing unit 295.

The control unit 290 can repeat the setting of the voltage/current values of the control signal generator 280, the triggering of measurements done by the converter unit 210, and the triggering value accumulation of the averaging or processing unit 220 until a desired number of measurements is available for an averaging operation. As the number of measurement values is equal or higher than a predefined number, the control logic triggers the processing unit 220 to conduct averaging and division or division and averaging operations and provide the result as a result of the measurement unit 200.

The measurement unit can be applied in an ASIC. The measurement unit is generic and can be used with a TDC and/or an ADC as a converter unit, or with other converters as well.

The converter in question can be, for example, a TDC based on a ring oscillator (RO) which converts the time between the edges of two static clock signals into a digital value. The TDC measures continuously, or quasi-continuously, the time between an edge of the first clock signal to the edge of the second clock signal. While the time of a full clock period of is calculated by the computing unit, based on a stable reference quantity and a control signal. Both the measurements and the calculations can be done simultaneously and the results can be in the units of RO stage delay values.

The measurement result value can be, for example, the phase deviation of both clock signals and not the absolute time values. Accordingly, the final measurement result values are calculated as a quotient between the time deviation of both clock edges ($T_{edge}$) and the calculated clock period ($T_{period}$):

$$\varphi = 2\pi \frac{T_{edge}}{T_{period}}$$

Both values are measured in units of RO stage delay. Thus, the division (or dividing both values) cancels out the RO stage delay value from the calculation, at least partially. This is making the TDC or the measurement unit self-calibrating because the measurement result does not depend on the RO stage delay value.

The final measurement result of the measurement unit comprising a RO based TDC with modulated RO supply voltage is a quotient between two time values in a way that the actual RO period or RO stage delay value is cancelled out by the division.

The resolution of a single measurement of a RO based TDC is determined by the stage delay of a single RO inverter. In some cases, the RO inverter delay can be ~4 ps, which can be the RO measurement resolution. In contradiction to this, in some cases, a resolution of <1 ps is required for the edge delay or edge-to-edge measurement and for the clock period measurement/calculation.

The RO stage delay can be changed in small ranges by varying the supply voltage of the RO's inverter stages. To make the measurement non-static the RO supply voltage is changed from measurement to measurement. Each single measurement is performed with another RO stage delay. The RO stage delay does not affect the final measurement result because of the self-calibrating TDC in which the division cancels out the RO stage delay value.

In other words, using a TDC as a converter unit, the phase deviation of both clock signals, φ, and not the absolute time values are requested. The final measurement result is calculated as quotient between the time deviation of both clock edges, $T_{edge}$, and the clock period, $T_{period}$:

$$\varphi = 2\pi \frac{T_{edge}}{T_{period}}$$

The quantization step size does not affect the final measurement result because the division of durations cancel out the quantization step sizes. Division is done over a high number of measurements, n, and results in a non-static measurement that can be improved in resolution. The resolution is improved by a simple averaging over a high number of measurements:

$$\varphi_{average} = \frac{1}{n}\sum_{k=1}^{n}\varphi(k)$$

A final implementation in an application specific integrated circuit (ASIC) can use some optimization to save calculation effort. The converter unit, such as TDC, delivers a series of measurements, n, or measurement pairs, such as a series of first digitized values and calculated second values, for example, containing the time difference between both clock's edges, $T_{edges}(k)$, and the clock period, $T_{period}(k)$. The result of each measurement is the quotient of both values (for simplicity, the factor $2\pi$ is deducted):

$$r(k) = \frac{T_{edge}(k)}{T_{period}(k)}$$

Averaging over a number of n measurements leads to the following equation:

$$\text{result} = \frac{1}{n} = \sum_{k=1}^{n} r(k) = \frac{1}{n}\sum_{k=1}^{n}\frac{T_{edeg}(k)}{T_{period(k)}}$$

The complexity of this calculation is n+1 divisions and n adders.

Since the quotient r(k) is not an integer value, it is required to use fixed point calculation. Using fixed point calculation reduces the accuracy of the calculation because of the limited number of result bits of each division. The least significant parts of the calculation result gets cut off after each measurement step. In addition to this the division itself is a resource hungry operation that should be avoided.

A simplification can be used by calculating the average of all first digital values and all second digital values separately and then calculating the final result as quotient of both averaged results.

$$\text{result} = \frac{\sum_{k=1}^{n} T_{edge}(k)}{\sum_{k=1}^{n} T_{period}(k)}$$

The complexity of the calculation by n measurement pairs is one division and 2·n adders which is less complex than the first, initial approach.

It can be shown that the above equation is valid for the static use case with:

$$\frac{T_{edge}(k_1)}{T_{period}(k_1)} \approx \frac{T_{edge}(k_2)}{T_{period}(k_2)}$$

The invention claimed is:

1. An apparatus configured to provide a measurement result value based on a first input signal, wherein the apparatus comprises:
a converter unit configured to provide first values, wherein the first values are based on one of the first input signal; and the first input signal and a second input signal,
wherein a quantization step size of the first values is based on a control signal of the converter unit,
a measurement unit configured to calculate second values, which represent a reference quantity for a plurality of quantization step sizes associated with different values of the control signal, and wherein the measurement unit is further configured to change the control signal between a determination of different first values or a determination of different second values, wherein different first values are provided using different converter quantization step sizes and, wherein different second values are provided using different converter quantization step sizes of the plurality of quantization step sizes; and
a processing unit configured to perform averaging and division operations to provide the measurement result value from a predefined number of first values and a predefined number of second values, wherein an effect of the converter quantization step size on the first values and an effect of the quantization step sizes on the second values at least partially cancels out,
wherein the converter unit and the processing unit are comprised within the measurement unit, wherein the division operations provide an intermediate result, wherein the averaging operations improve a resolution of the intermediate result and provide the measurement result value, and wherein the first and second input signals comprise at least one of: a clock value; and a voltage.

2. The apparatus according to claim 1, where the quantization step size is calculated from a value of the control signal.

3. The apparatus according to claim 1, wherein the processing unit is further configured to determine the measurement result value on the basis of the first values and on the basis of the second values using averaging.

4. The apparatus according to claim 1, wherein the processing unit is further configured to average quotient values of the first values and the second values to obtain the measurement result value.

5. The apparatus according to claim 1, wherein the processing unit is further configured to calculate the measurement result value based on a following equation:

$$\text{result} = \frac{1}{n} \cdot \sum_{k=1}^{n} \frac{val_1(k)}{val_2(k)}$$

Wherein:
result represents the measurement result value,
n represents a predefined number of measurements,
$val_1(k)$ represents the k-th element of the predefined number of first values,
$val_2(k)$ represents the k-th element of the predefined number of second values,
k represents a running variable.

6. The apparatus according to claim 1, wherein the processing unit is further configured to perform one of: calculate a quotient value of a sum of the first values and a sum of the second values; and calculate a quotient value of an average of the first values and an average of the second values in order to obtain the measurement result value.

7. The apparatus according to claim 1, wherein the processing unit is further configured to calculate the measurement result value based on a following equation:

$$\text{result} = \frac{\sum_{k=1}^{n} val_1(k)}{\sum_{k=1}^{n} val_2(k)}$$

Wherein:
result represents the measurement result value,
n represents a predefined number of measurements,
$val_1(k)$ represents the k-th element of the predefined number of first values,
$val_2(k)$ represents the k-th element of the predefined number of second values,
k represents a running variable.

8. The apparatus according to claim 1, wherein the control signal is one of: a control voltage signal; and a control current signal.

9. The apparatus according to claim 1, wherein the control signal comprises one of:
an increasing and/or decreasing ramp signal;
a periodically increasing and decreasing triangular signal;
a signal based on a mathematical function;
a random and/or pseudo-random signal; and
an arbitrary waveform stored in a memory.

10. The apparatus according to claim 1, wherein the measurement unit further comprises a control signal generator.

11. The apparatus according to claim 1, wherein the measurement unit comprises a control logic configured to control the converter unit or the processing unit or the control signal.

12. The apparatus according to claim 1, wherein the first input signal and the second input signal are constant over a predefined number of measurements.

13. The apparatus according to claim 1, wherein the converter unit comprises a time-to-digital converter or an analog-to-digital converter.

14. The apparatus according to claim 1, wherein the converter unit comprises a time-to-digital converter operable to alternatively generate:
time values from an edge of the first input signal to an edge of the second input signal, and
time values of a period of the first input signal or a period of the second input signal.

15. The apparatus according to claim 1, wherein the converter unit comprises an analog-to-digital operable to provide first voltage or current values from the first input signal.

16. The apparatus according to claim 14, wherein the quantization step sizes alternatively vary based on:
the time values of a period of the first input signal or of the second input signal; and
the time values from the edge of the first input signal and the edge of the second input signal are varied.

17. The apparatus according to claim 14, wherein the measurement result value comprises a phase deviation between the first input signal and the second input signal.

18. The apparatus according to claim 14, where a ratio between the frequency of the first input signal and the frequency of the second input signal is equal to a ratio between a first integer number and a second integer number being smaller than 20.

19. The apparatus according to claim 14, wherein the control signal of the converter unit varies frequency of one or more oscillator circuits which act as a time reference.

20. The apparatus according to claim 14, wherein the control signal of the converter unit varies an input electric supply of an oscillator in order to vary the quantization step sizes.

21. The apparatus according to claim 14, wherein the converter unit comprises delay stages.

22. The apparatus according to claim 21, wherein the control signal of the converter unit varies a delay of delay stages of a plurality of coupled delay stages to vary the quantization step size.

23. The apparatus according to claim 14, wherein the quantization step sizes are varied by at least 5%.

24. The measurement unit, according to claim 14, wherein the control signal of the converter unit changes time unit.

25. The apparatus according to claim 15, wherein the quantization step size of the first values is varied, and wherein the first values comprise voltage or current values.

26. The apparatus according to claim 15, wherein the measurement result value comprises a quotient value.

27. The apparatus according to claim 15, wherein the first input signal comprises a current signal and wherein the calculated second values comprise current quantities.

28. The apparatus according to claim 15, wherein the control signal of the converter unit changes a voltage or current reference.

29. The apparatus according to claim 15, wherein the control signal of the converter unit varies a supply signal of an analog-to-digital converter to vary the quantization step size.

30. The apparatus according to claim 15, wherein the quantization step sizes are varied by at least 50%.

31. The apparatus according to claim 15, wherein the quantization step sizes are varied by at least 100%.

32. A system to determine a measurement result value based on a first input signal, the system comprises:
a measurement unit; a converter unit; and a processing unit,
wherein the converter unit is configured to provide first values, wherein the first values are based on one of: the first input signal; and the first input signal and a second input signal, and wherein a quantization step size of the first values are based on a control signal of the converter unit,
wherein the measurement unit is configured to calculate second values representing a reference quantity for a plurality of quantization step sizes associated with different values of the control signal, and wherein the measurement unit is further configured to change the control signal between a determination of different first values and a determination of different second values, wherein different first values are provided using different converter quantization step sizes and wherein different second values are provided using different quantization step sizes of the plurality of quantization step sizes; and wherein the processing unit is configured to perform averaging and division operations to calculate the measurement result value from a predefined number of first values and a predefined number of second values, wherein the effects of the quantization step size on the first values and on the second values partially cancel out, wherein the division operations provide an intermediate result, and wherein the averaging operations improve a resolution of the intermediate result and provide the measurement result value, and wherein the first and second input signals comprise at least one of: a clock value; and a voltage.

33. A method to determine a measurement result value based on a first input signal comprising:

providing first values, wherein the first values are based on the first input signal, or wherein the first values are derived from the first input signal and a second input signal, wherein a quantization step size of the first values is based on a control signal of the converter unit;

calculating second values representing a reference quantity for a plurality of quantization step sizes associated with different values of the control signal, and wherein the measurement unit is further configured to change the control signal of the converter unit between a determination of different first values and a determination of different second values, wherein different first values are provided using different converter quantization step sizes and wherein different second values are provided using different quantization step sizes of the plurality of quantization step sizes; and performing averaging and division operations to compute the measurement result value from a predefined number of first values and a predefined number of second values, wherein an impact of the quantization step size onto the first values and an impact of a quantization step size of the plurality of quantization step sizes onto the second values partially cancels out, wherein the division operations provide an intermediate result, and wherein the averaging operations improve a resolution of the intermediate result and provide the measurement result value, and wherein the first and second input signals comprise at least one of: a clock value; and a voltage.

* * * * *

UNITED STATES PATENT AND TRADEMARK OFFICE
CERTIFICATE OF CORRECTION

PATENT NO. : 12,413,238 B2
APPLICATION NO. : 17/733403
DATED : September 9, 2025
INVENTOR(S) : Andreas Beermann It is certified that error appears in the above-identified patent and that said Letters Patent is hereby corrected as shown below:

In the Claims

Column 14, Claim 1, Line 41, please insert --the-- after of;

Column 14, Claim 1, Line 42, please insert --the-- after of;

Column 14, Claim 3, Line 59, please delete "the basis" and insert --a basis--;

Column 14, Claim 3, Line 60, please delete "the basis" and insert --a basis--;

Column 15, Claim 5, Line 9, please delete "represents the" and insert --represents a--;

Column 15, Claim 5, Line 11, please delete "represents the" and insert --represents a--;

Column 15, Claim 7, Line 33, please delete "represents the" and insert --represents a--;

Column 15, Claim 7, Line 35, please delete "represents the" and insert --represents a--;

Column 16, Claim 18, Line 14, please delete "where" and insert --wherein--;

Column 16, Claim 18, Line 15, please delete "between the" and insert --between a--;

Column 16, Claim 18, Line 15, please delete "and the" and insert --and a--;

Column 16, Claim 32, Line 63, please delete "are" and insert --is--;

Column 17, Claim 32, Line 12, please insert --the-- after of;

Column 17, Claim 32, Line 13, please insert --the-- after of;

Signed and Sealed this
Twenty-eighth Day of October, 2025

John A. Squires
*Director of the United States Patent and Trademark Office*

Column 17, Claim 32, Line 14, please delete "the" after wherein;

Column 17, Claim 33, Line 25, please delete "the" after wherein;

Column 18, Claim 33, Line 2, please delete "the" and insert --a--;

Column 18, Claim 33, Line 6, please delete "the" and insert --a --.